US009618562B2

(12) United States Patent
Furutani

(10) Patent No.: US 9,618,562 B2
(45) Date of Patent: Apr. 11, 2017

(54) SEMICONDUCTOR DEVICE

(71) Applicant: Micron Technology, Inc., Boise, ID (US)

(72) Inventor: Kiyohiro Furutani, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 14/472,226

(22) Filed: Aug. 28, 2014

(65) Prior Publication Data

US 2015/0061722 A1 Mar. 5, 2015

(30) Foreign Application Priority Data

Aug. 28, 2013 (JP) .................. 2013-176578

(51) Int. Cl.
*G01R 31/26* (2014.01)
*G11C 29/00* (2006.01)
*G11C 29/12* (2006.01)
*G11C 5/14* (2006.01)

(52) U.S. Cl.
CPC ........ *G01R 31/2644* (2013.01); *G11C 29/006* (2013.01); *G11C 29/12005* (2013.01); *G11C 5/147* (2013.01)

(58) Field of Classification Search
CPC G01R 31/2644; G01R 31/26; G01R 31/2601; G01R 31/2607; G01R 31/2637; G01R 31/318505; G01R 31/318511; G01R 1/0491; G11C 29/006; G11C 29/12; G11C 29/12005
See application file for complete search history.

(56) References Cited

U.S. PATENT DOCUMENTS

| 5,568,054 | A | | 10/1996 | Iino et al. | |
|---|---|---|---|---|---|
| 5,841,271 | A | * | 11/1998 | Nakayama | ............ H03F 3/3001 323/298 |
| 6,657,452 | B2 | * | 12/2003 | Beer | .................. G01R 31/2884 324/762.02 |
| 7,248,102 | B2 | * | 7/2007 | Haetty | ............. G01R 31/31721 327/530 |
| 2006/0186907 | A1 | * | 8/2006 | Haetty | ............... G01R 31/3004 324/754.03 |
| 2006/0221735 | A1 | * | 10/2006 | Matsumoto | .......... G11C 29/006 365/201 |
| 2009/0010078 | A1 | * | 1/2009 | Do | ........................ G11C 5/147 365/189.09 |

(Continued)

*Primary Examiner* — Huy Q Phan
*Assistant Examiner* — David Frederiksen
(74) *Attorney, Agent, or Firm* — Dorsey & Whitney LLP

(57) ABSTRACT

Disclosed herein is an apparatus that includes a first internal-potential generation circuit that generates a first internal potential from a power supply potential and that outputs the first internal potential to a first node, and an internal-potential force circuit that includes a first switch element provided between the first node and a second external terminal. The internal-potential force circuit causes the first switch element to enter into an off-state when the test signal supplied to a third external terminal is activated and a potential level of a first external terminal is a first level, and causes the first switch element to enter into an on-state when the test signal supplied to the third external terminal is activated and the potential level of the first external terminal is a second level different from the first level.

6 Claims, 6 Drawing Sheets

(56) References Cited

U.S. PATENT DOCUMENTS

2012/0033506 A1 2/2012 Furutani et al.
2012/0109561 A1 5/2012 Terui
2012/0218019 A1* 8/2012 Lee .................. G11C 5/145
                                                   327/331

* cited by examiner

SEMICONDUCTOR DEVICE

BACKGROUND OF THE INVENTION

Field of the Invention

Embodiments of the present invention relate to a semiconductor device, and more particularly relates to a semiconductor device as a target for a wafer test performed using a probe card.

Description of Related Art

When a wafer test on a semiconductor device such as a DRAM (Dynamic Random Access Memory) is to be performed, predetermined potentials and signals are supplied from a tester through a probe card to a plurality of semiconductor devices formed on one wafer. Each of the semiconductor devices is configured to perform a predetermined test operation in response to the potentials and the signals thus supplied. Japanese Patent Application Laid-open No. 2012-99603 discloses an example of a wafer test on a DRAM. Japanese Patent Application Laid-open No. H6-53299 discloses an example of a probe card.

The voltages supplied to a semiconductor device during a wafer test include a power supply potential VDD and a reference potential VREF0. Among these, the reference potential VREF0 is a voltage serving as a reference when the semiconductor device generates various internal potentials, and the reference potential VREF0 itself is an internal potential generated inside of the semiconductor device (see, for example, Japanese Patent Application Laid-open No. 2012-38389). While adjustment is required for the semiconductor device to generate the reference potential VREF0 of a correct value, the adjustment is not finished yet at the wafer test stage. Accordingly, there is a possibility that the reference potential VREF0 of a correct value is not generated and thus the reference potential VREF0 is supplied from a tester.

The probe card mentioned above has first and second power supply terminals that receive the power supply potential VDD and the reference potential VREF0, respectively, from the tester and a plurality of pins. The pins form sets of a predetermined number of pins (pin sets) for the semiconductor devices as test targets, respectively. Each of the pin sets includes a first pin for supplying the power supply potential VDD and a second pin for supplying the reference potential VREF0.

The first pins in the pin sets are connected in parallel to the first power supply terminal. Accordingly, the power supply potential VDD is supplied from the tester to the first pins in common. When the wafer test is to be conducted, the first pins are connected to first pads provided on surfaces of the corresponding semiconductor devices, respectively. Each of the first pads is connected to a power supply line provided throughout the inside of the corresponding semiconductor device and thus the power supply potential VDD can be supplied from the tester to internal circuits of the semiconductor device.

The second pins in the pin sets are connected in parallel to the second power supply terminal. Accordingly, the reference potential VREF0 is supplied from the tester to the second pins in common. The second pins are connected to second pads provided on the surfaces of the corresponding semiconductor devices, respectively, when the wafer test is to be conducted. Each of the second pads is connected to an output end (hereinafter, "first node") of a reference-potential generation circuit, which is located in the semiconductor device and functions to generate the reference potential VREF0. Therefore, the reference potential VREF0 generated in the semiconductor device normally can be replaced with the reference potential VREF0 supplied from the tester.

The wafer test is conducted on the semiconductor devices as the test targets in turn. For this purpose, a first relay is provided between each of the first pins and the first power supply terminal. When a test on a certain semiconductor device is to be conducted, only the first relay corresponding to the semiconductor device is brought to a connection state and the remaining first relays are brought to a disconnection state. Accordingly, the power supply potential VDD is supplied only to the semiconductor device that is being tested.

A second relay is provided between each of the second pins and the second power supply terminal. The second relays are provided to prevent a situation that, in a semiconductor device to which supply of the power supply potential VDD from the tester is interrupted due to a disconnection state of the first relay, a leak current flows from the first node mentioned above to the reference-potential generation circuit, a current thus flows to the corresponding second pin, and that a current supply capacity of the tester consequently becomes insufficient, whereby a sufficient reference potential VREF0 cannot be supplied to the semiconductor device being tested. The leak current is a current flowing from the first node toward an n-well that forms the body of a P-channel MOS transistor forming the output end of the reference-potential generation circuit. Such a leak current possibly occurs when the power supply potential VDD is not supplied to a source of the P-channel MOS transistor. Because a disconnection state of the second relay stops supply of the reference potential VREF0 to the first node, a flow of a current to the second pin can be prevented.

However, in more recent wafer testing, examination of as many as 500 semiconductor devices needs to be performed in one test and the number of semiconductor devices to be examined in one test will further increase in the future. Therefore, the configuration using the two relays for each semiconductor device as the test target is not preferable in terms of downscaling of the probe card. Accordingly, a semiconductor device that can reduce the number of relays to be mounted on a probe card is demanded.

SUMMARY

In one embodiment, there is provided a semiconductor device that includes: a first external terminal configured to be supplied with a power supply potential from outside the semiconductor device; a second external terminal configured to be supplied with a first internal potential from outside; a third external terminal configured to be supplied with a test signal to be activated when the semiconductor device enters a test mode; a first internal-potential generation circuit configured to generate the first internal potential from the power supply potential and output the first internal potential to a first node; and an internal-potential force circuit that includes a first switch element coupled between the first node and the second external terminal, the internal-potential force circuit configured to cause the first switch element to enter into an off-state when the test signal supplied to the third external terminal is activated and a potential level of the first external terminal is a first level, and cause the first switch element to enter into an on-state when the test signal supplied to the third external terminal is activated and the potential level of the first external terminal is a second level different from the first level.

According to the embodiment of the present invention, the internal-potential force circuit can disconnect the first node from the second external terminal when the test signal supplied to the third external terminal is activated and a potential level of the first external terminal is at the first level (a low level). Therefore, lack of a current supply capacity of a tester due to a leak current flowing from the first node toward the first internal-potential generation circuit can be prevented without second relays in a probe card. Accordingly, the number of relays to be mounted on the probe card can be reduced.

DETAILED DESCRIPTION OF THE EMBODIMENTS

Embodiments of the present invention will be explained below in detail with reference to the accompanying drawings. A configuration of a wafer test system 100 according to the background art of the present invention and problems thereof are explained below and then a configuration of a wafer test system 1 according to an embodiment of the present invention is explained.

Figure 5:
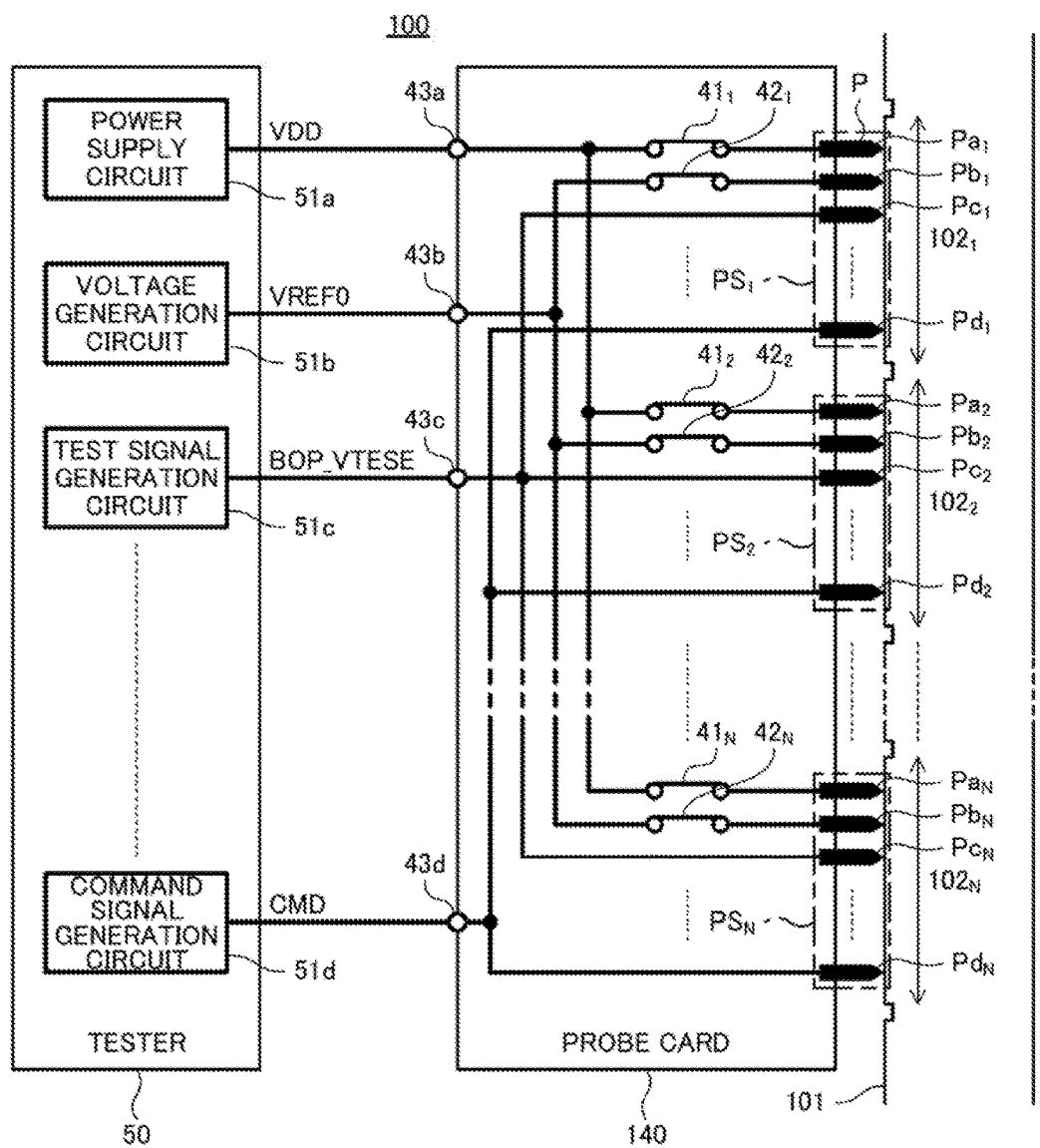
FIG. 5 shows a configuration of a wafer test system according to a background art of the present invention.

The wafer test system 100 according to the background art of the present invention is a system for testing a plurality of semiconductor chips 102 (semiconductor devices) formed on a surface of a wafer 101 and is configured to have a tester 50 and a probe card 140 as shown in FIG. 5. In FIG. 5, the number of the semiconductor chips 102 to be tested at one time is N. When the individual semiconductor chips 102 and configurations corresponding thereto need to be distinguished from each other in the following explanations, they are distinguished using numbers of 1 to N shown in subscript in FIG. 5.

The tester 50 is configured to include a power supply circuit 51a that generates the power supply potential VDD, a voltage generation circuit 51b that generates the reference potential VREF0, a test-signal generation circuit 51c that generates a test signal BOP_VTESE, and a command-signal generation circuit 51d that generates various kinds of command signals CMD. The generated potentials and signals are supplied to each of the semiconductor chips 102 formed on the surface of the wafer 101 through the probe card 140. While not shown in FIG. 5, the tester 50 may also include various circuits such as a power supply circuit that generates a ground potential VSS, in addition to the circuits described above.

The probe card 140 is configured to include terminals 43a to 43d that receive supply of the power supply potential VDD, the reference potential VREF0, the test signal BOP_VTESE, and the command signal CMD, respectively, from the tester 50 and a plurality of pins P connected to test pads (explained later) provided on surfaces of the semiconductor chips 102, respectively.

While only four different types of terminals are shown in FIG. 5, other types of terminals such as a terminal that receives supply of the ground potential VSS may also be provided in the probe card 140. Although FIG. 5 illustrates for sake of convenience one terminal for each of the terminals 43a to 43d, pluralities of the terminals 43a to 43d may be provided, respectively. For example, when the command signal CMD includes a plurality of bits, the terminal 43d can include a plurality of terminals corresponding to the bits, respectively. In this case, the same number of pins Pd explained later as that of the terminals included in the terminal 43d is also provided for each of the semiconductor chips 102.

The pins P form sets of a predetermined number of pins (pin sets $PS_1$ to $PS_N$) for the semiconductor chips 102 as the test targets, respectively. The pin set $PS_k$ (k is an integer from 1 to N) is for supplying the various potentials and signals to the semiconductor chip 102; and is configured to include pins P for the terminals of the probe card 140, respectively. Specifically, as shown in FIG. 5, the pin set $PS_k$ is configured to include pins $Pa_k$ to $Pd_k$ corresponding to the terminals 43a to 43d, respectively.

The pins $Pa_1$ to $Pa_N$ are connected in parallel to the terminal 43a. Accordingly, the power supply potential VDD is supplied from the tester 50 to the pins $Pa_1$ to $Pa_N$ in common. Similarly, the pins $Pb_1$ to $Pb_w$ are connected in parallel to the terminal 43b. Accordingly, the reference potential VREF0 is supplied from the tester 50 to the pins $Pb_1$ to $Pb_N$ in common. The pins $Pc_1$ to $Pc_N$ are connected in parallel to the terminal 43c. Accordingly, the test signal BOP_VTESE is supplied from the tester 50 to the pins $Pc_1$ to $Pc_N$ in common. The pins $Pd_1$ to $Pd_N$ are connected in parallel to the terminal 43d. Accordingly, the command signal CMD is supplied from the tester to the pins $Pd_1$ to $Pd_N$ in common.

The wafer test is conducted in turn on the semiconductor chips 102 as the test targets in a state where the pins P forming the pin sets $PS_1$ to $PS_N$ are brought into contact with the corresponding test pads, respectively. To address this procedure of the test, the probe card 140 includes a first relay $41_k$ and a second relay $42_k$ with respect to the pin set $PS_k$.

The first relay $41_k$ is placed between the corresponding pin $Pa_k$ and the terminal 43a and is brought to a connection state in a case where the corresponding semiconductor chip $102_k$ is to be tested while being brought to a disconnection state in other cases. Accordingly, the power supply potential VDD is supplied only to one of the semiconductor chips 102 that is being tested.

The second relay $42_k$ is placed between the corresponding pin $Pb_k$ and the terminal 43b. The second relay $42_k$ is brought to a connection state in a case where the corresponding semiconductor chip $102_k$ is to be tested while being brought to a disconnection state in other cases, as the first relay $41_k$. Significance of provision of the second relay $42_k$ will be explained in greater detail below.

Figure 6:
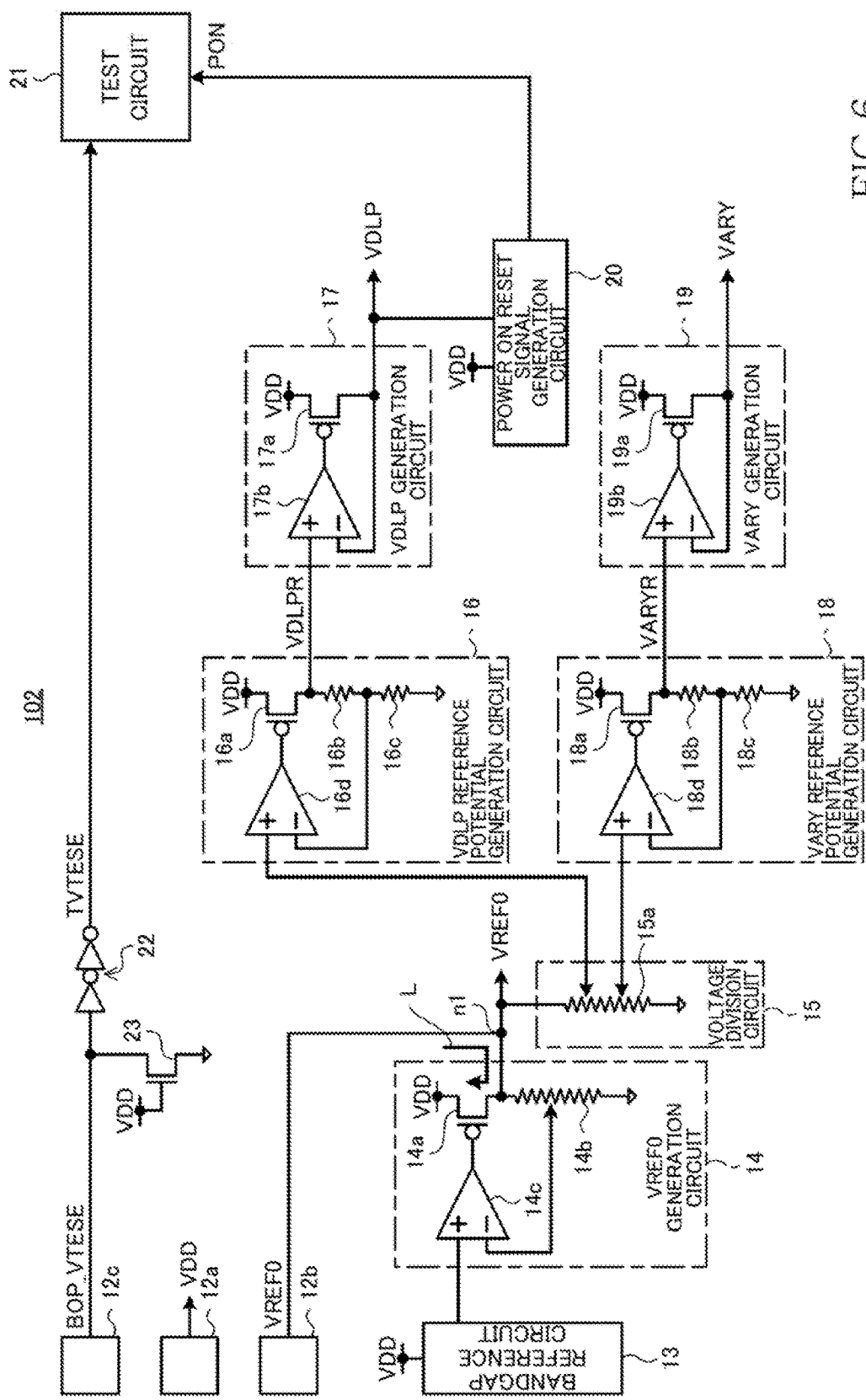
FIG. 6 shows an internal configuration of a semiconductor chip shown in FIG. 5.

As shown in FIG. 6, each of the semiconductor chips 102 is configured to have test pads 12a to 12c (first to third external terminals) to be connected to the pins Pa to Pc shown in FIG. 5, respectively. Each of the semiconductor chips 102 is configured to also have a bandgap reference circuit 13 that outputs a constant voltage, a VREF0 generation circuit 14 (first internal-potential generation circuit) that generates the reference potential VREF0 (first internal potential), a voltage division circuit 15, a VDLP reference-potential generation circuit 16 that generates a reference potential VDLPR for an internal potential VDLP, a VDLP generation circuit 17 (second internal-potential generation circuit) that generates the internal potential VDLP (second internal potential). A VARY reference-potential generation circuit 18 that generates a reference potential VARYR for an internal potential VARY, a VARY generation circuit 19 that generates the internal potential VARY, a power-on reset-signal generation circuit 20 that generates a power-on reset signal PON, and a test circuit 21 as a target for the wafer test are also included in each of the semiconductor chips 102. While a test pad to be connected to the pin Pd shown in FIG. 5 is also provided in each of the semiconductor chips 102, illustrations thereof are omitted in FIG. 5.

The power supply potential VDD is supplied from the tester to the test pad 12a via the corresponding pin Pa. Although not shown, a power supply line is provided like a mesh throughout in each of the semiconductor chips 102 and the test pad 12a is connected to the mesh power supply line. The power supply potential VDD supplied to the test pad 12a is supplied to respective circuits in the semiconductor chip 102 through the mesh power supply line.

The reference potential VREF0 is supplied from the tester to the test pad 12b via the corresponding pin Pb. The test pad 12b is connected to a first node n1 forming an output end of the VREF0 generation circuit 14.

The test signal BOP_VTESE is supplied from the tester 50 to the test pad 12c via the corresponding pin Pb. The test pad 12c is connected to the test circuit 21 via a buffer 22. Accordingly, the test signal BOP_VTESE is supplied to the test circuit 21 as an output signal TVTESE of the buffer 22.

A line connecting the test pad 12c and the buffer 22 to each other is connected to one end of an N-channel MOS transistor 23 of which the other end is connected to a ground line (a power supply line to which the ground potential VSS is supplied). The power supply potential VDD is supplied to a control electrode (a gate electrode) of the transistor 23. As a result, while the power supply potential VDD is supplied to the test pad 12a, the transistor 23 is always ON and thus the line connecting the test pad 12c and the buffer 22 is short-circuited with the ground line.

An object to install the transistor 23 is to keep an input end of the buffer 22 at the ground potential in a case where the test signal BOP_VTESE is not supplied to the test pad 12c. The input end of the buffer 22 in a case where the test signal BOP_VTESE is supplied to the test pad 12c needs to be at a potential corresponding to a potential of the test signal BOP_VTESE, which is realized by setting the size of the transistor 23 to be sufficiently small.

The bandgap reference circuit 13 is a constant voltage circuit that outputs a constant voltage of a potential level corresponding to bandgap energy of silicon. The VREF0 generation circuit 14 is configured to generate the reference potential VREF0 based on the output voltage of the bandgap reference circuit 13 and the power supply potential VDD. An output end of the VREF0 generation circuit 14 is connected to the first node n1 mentioned above.

Specifically, the VREF0 generation circuit 14 is configured to have a P-channel MOS transistor 14a, a resistor 14b, and an operational amplifier 14c. The resistor 14b is configured to have a plurality of intermediate points. The transistor 14a and the resistor 14b are connected in series between the power supply line to which the power supply potential VDD is supplied and the ground line. An output terminal of the operational amplifier 14c is connected to a control electrode (a gate electrode) of the transistor 14a. The output voltage of the bandgap reference circuit 13 is supplied to a non-inverting input terminal of the operational amplifier 14c. An inverting input terminal of the operational amplifier 14c is connected to any of the intermediate points (hereinafter, "first connection intermediate point") of the resistor 14b. While being initially variable, the first connection intermediate point is fixed by laser trimming or the like performed at one stage of the wafer test. The reference potential VREF0 is provided from a connection point between the transistor 14a and the resistor 14b.

A specific value of the reference potential VREF0 generated by the VREF0 generation circuit 14 is defined by a level of the power supply potential VDD, a level of the output voltage of the bandgap reference circuit 13, and the first connection intermediate point. Because the power supply potential VDD is supplied from outside, the level can be regarded as a constant value. Meanwhile, the level of the output voltage of the bandgap reference circuit 13 may vary for each of semiconductor chip 102. The variation is accommodated by changing the first connection intermediate point with respect to each of the semiconductor chips 102. Therefore, the reference potential VREF0 generated by the VREF0 generation circuit 14 after the first connection intermediate point is fixed by laser trimming or the like highly accurately has a constant value that does not depend on the semiconductor chips 102.

The voltage division circuit 15 is a circuit that divides the reference potential VREF0 and supplies a resultant potential to the VDLP reference-potential generation circuit 16 and the VARY reference-potential generation circuit 18. Specifically, the voltage division circuit 15 has a resistor 15a having a plurality of intermediate points as the resistor 14b. An input end of the VDLP reference-potential generation circuit 16 and an input end of the VARY reference-potential generation circuit 18 are connected to any of the intermediate points, respectively. The intermediate point to which the input end of the VDLP reference-potential generation circuit 16 is connected (hereinafter, "second connection intermediate point") and the intermediate point to which the input end of the VARY reference-potential generation circuit 18 is connected (hereinafter, "third connection intermediate point") can be the same or different. While being initially variable, the second and third connection intermediate points are both fixed by laser trimming or the like performed at one stage of the wafer test.

The VDLP reference-potential generation circuit 16 is a circuit configured to generate the reference potential VDLPR based on the potential supplied from the voltage division circuit 15 and the power supply potential VDD. The VDLP reference-potential generation circuit 16 includes a P-channel MOS transistor 16a, resistors 16b and 16c, and an operational amplifier 16d as shown in FIG. 6. The transistor 16a and the resistors 16b and 16c are connected in series between the power supply line to which the power supply potential VDD is supplied and the ground line. An output terminal of the operational amplifier 16d is connected to a control electrode (a gate electrode) of the transistor 16a. The output potential of the voltage division circuit 15 is supplied to a non-inverting input terminal of the operational amplifier 16d. An inverting input terminal of the operational amplifier 16d is connected to a connection point between the resistors 16b and 16c. The reference potential VDLPR is provided from a connection point between the transistor 16a and the resistor 16b.

The VDLP generation circuit 17 is a drive circuit that generates the internal potential VDLP at an equal level to that of the reference potential VDLPR and is configured to have a P-channel MOS transistor 17a and an operational amplifier 17b as shown in FIG. 6. The transistor 17a is connected between the power supply line to which the power supply potential VDD is supplied and an inverting input terminal of the operational amplifier 17b. An output terminal of the operational amplifier 17b is connected to a control electrode (a gate electrode) of the transistor 17a. The reference potential VDLPR is supplied from the VDLP reference-potential generation circuit 16 to a non-inverting input terminal of the operational amplifier 17b. The internal potential VDLP is provided from a drain of the transistor 17a (a connection point with the inverting input terminal of the operational amplifier 17b).

The VARY reference-potential generation circuit 18 is a circuit that generates the reference potential VARYR based on the potential supplied from the voltage division circuit 15 and the power supply potential VDD. The VARY reference-potential generation circuit 18 has an identical circuit configuration to that of the VDLP reference-potential generation circuit 16. Specifically, as shown in FIG. 6, the VARY reference-potential generation circuit 18 is configured to have a P-channel MOS transistor 18a, resistors 18b and 18c, and an operational amplifier 18d. The transistor 18a and the resistors 18b and 18c are connected in series between the power supply line to which the power supply potential VDD is supplied and the ground line. An output terminal of the operational amplifier 18d is connected to a control electrode (a gate electrode) of the transistor 18a. The output potential of the voltage division circuit 15 is supplied to a non-inverting input terminal of the operational amplifier 18d. An inverting input terminal of the operational amplifier 18d is connected to a connection point between the resistors 18b and 18c. The reference potential VARYR is provided out from a connection point between the transistor 18a and the resistor 18b.

The VARY generation circuit 19 is a drive circuit that generates the internal potential VARY at an equal level to that of the reference potential VARYR, and has an identical circuit configuration to that of the VDLP generation circuit 17. Specifically, as shown in FIG. 6, the VARY generation circuit 19 is configured to have a P-channel MOS transistor 19a and an operational amplifier 19b. The transistor 19a is connected between the power supply line to which the power supply potential VDD is supplied and an inverting input terminal of the operational amplifier 19b. An output terminal of the operational amplifier 19b is connected to a control electrode (a gate electrode) of the transistor 19a. The reference potential VARYR is supplied from the VARY reference-potential generation circuit 18 to a non-inverting input terminal of the operational amplifier 19b. The internal potential VARY is provided from a drain of the transistor 19a (a connection point with the inverting input terminal of the operational amplifier 19b).

The fixing of the second and third connection intermediate points by laser trimming or the like is performed after the first connection intermediate point is fixed. Accordingly, the internal potential VDLP generated by the VDLP generation circuit 17 after the second connection intermediate point is fixed and the internal potential VARY generated by the VARY generation circuit 19 after the third connection intermediate point is fixed both highly accurately have constant values that do not depend on the semiconductor chips 102, respectively.

The power-on reset-signal generation circuit 20 is a circuit that generates the power-on reset signal PON for controlling an operation mode of the test circuit 21 based on potential levels of the power supply potential VDD and the internal potential VDLP. Specifically, the power-on reset-signal generation circuit 20 activates the power-on reset signal PON to a high level when the power supply potential VDD is at a high level (that is, a potential equal to or higher than a predetermined potential level). The power-on reset-signal generation circuit 20 deactivates the power-on reset signal PON when both of the power supply potential VDD and the internal potential VDLP are at a high level (that is, potentials equal to or higher than predetermined potential levels, respectively). The power-on reset signal PON is supplied to the test circuit 21.

The test circuit 21 is, for example, a memory cell array or a peripheral circuit thereof in the internal circuit of the semiconductor chip 102. The test circuit 21 is configured to perform a reset operation when the power-on reset signal PON is activated and perform a normal operation when the power-on reset signal PON is deactivated. While the normal operation in this case includes a test operation responding to the command signal CMD supplied from the tester 50, an entry of the test circuit 21 into a test mode is further conditioned on activation of the output signal TVTESE mentioned above to a high level (that is, activation of the test signal BOP_VTESE to a high level). A reason why activation of the test signal BOP_VTESE is used as one of the conditions of an entry into the test mode is to reduce probability of an erroneous entry of the test circuit into the test mode.

In the wafer test system 100 as mentioned above, if the second relays 42 (FIG. 5) are not provided, there is a risk that a sufficient level of the reference potential VREF0 cannot be supplied from the tester 50 to one of the semiconductor chips 102 being tested. This point is explained in detail below.

The fact that the second relays 42 are not provided means that the reference potential VREF0 supplied from the tester 50 is supplied also to the semiconductor chips 102 not being tested. Because the power supply potential VDD is not supplied to the semiconductor chips 102 not being tested, the power supply potential VDD is not supplied to a source of the transistor 14a shown in FIG. 6, either. If the reference potential VREF0 is supplied to the first node n1 in this state, a leak current L as shown in FIG. 6 flows from the first node n1 toward an n-well that forms the body of the transistor 14a. If such a leak current L flows in each of the semiconductor chips 102, the current supply capacity of the tester 50 becomes insufficient and thus a sufficient level of the reference potential VREF0 cannot be supplied to the semiconductor chip 102 being tested. The second relays 42 are provided to prevent this situation and, by causing all the second relays 42 corresponding to the semiconductor chips 102 not being tested to enter a disconnection state, a flow of the leak current L described above can be prevented, thereby preventing the tester 50 from lacking the current supply capacity.

However, as mentioned above, the configuration using two relays (the first and second relays 41 and 42) for each of the semiconductor chips 102 as the test targets is not preferable in terms of downscaling of the probe card 140. In the wafer test system 1 according to the present embodiment, the semiconductor chips include circuits that may be used to address the above problem related to the current supply capacity of the tester 50 without providing the second relays 42 in a probe card. A configuration of the wafer test system 1 and an operation thereof are explained in detail below.

Figure 1:
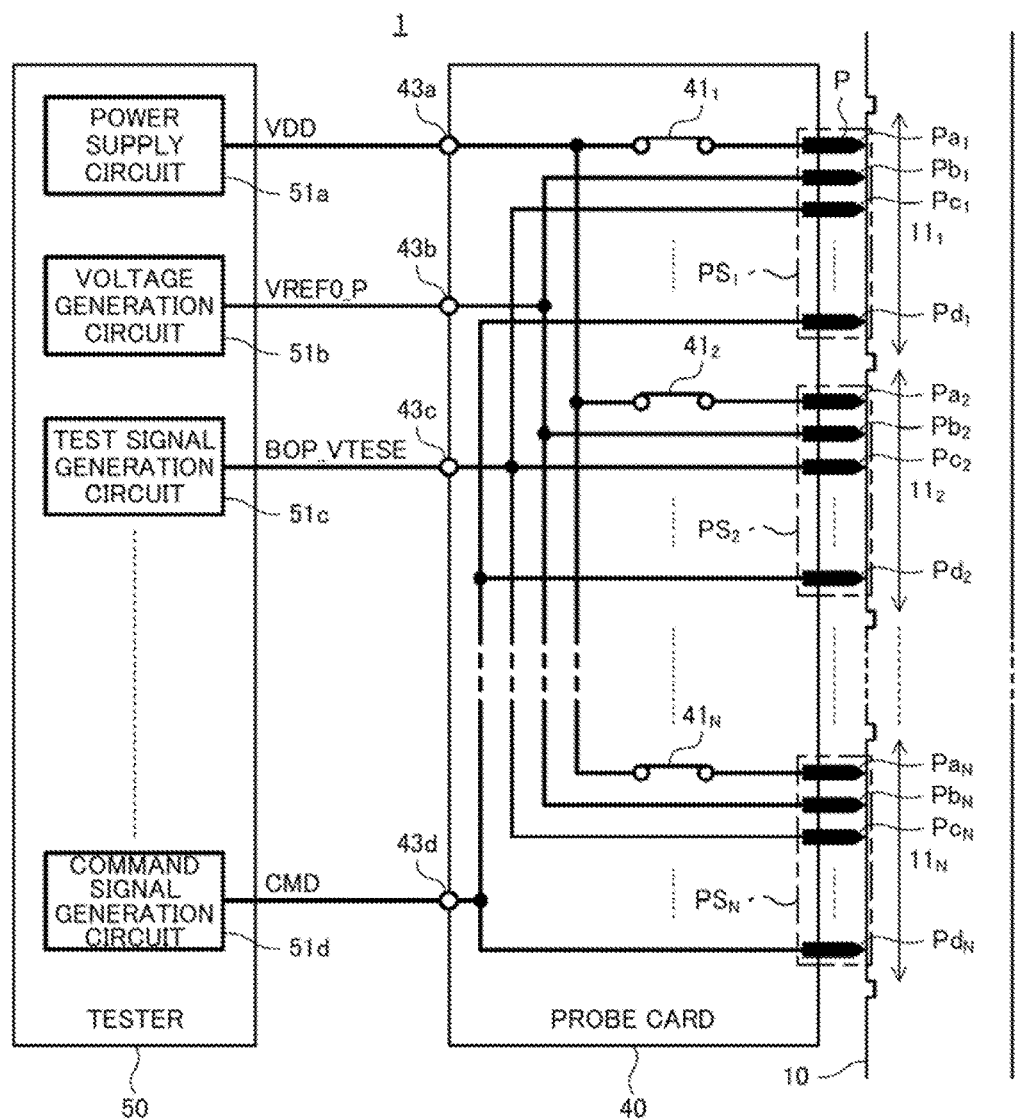
FIG. 1 shows a configuration of a wafer test system according to an embodiment of the present invention.

As shown in FIG. 1, the wafer test system 1 is a system for testing a plurality of semiconductor chips 11 (semiconductor devices) formed on a surface of a wafer 10 and is configured to have the tester 50 and a probe card 40. Differences from the wafer test system 100 are that the semiconductor chips 102 are replaced with the semiconductor chips 11 and that the probe card 140 is replaced with the probe card 40, and thus the following explanations are given focusing on the differences. While a reference potential output from the voltage generation circuit 51b in the tester 50 is denoted by VREF0_P, not by VREF0, this change is made for the purpose of explanations.

First, as can be understood by comparison between FIGS. 1 and 5, the probe card 40 has a configuration in which the second relays 42 are omitted from the probe card 140 and the pins Pb are connected directly to the terminal 43b. In other respects, the probe card 40 has the same configuration as that of the probe card 140.

Figure 2:
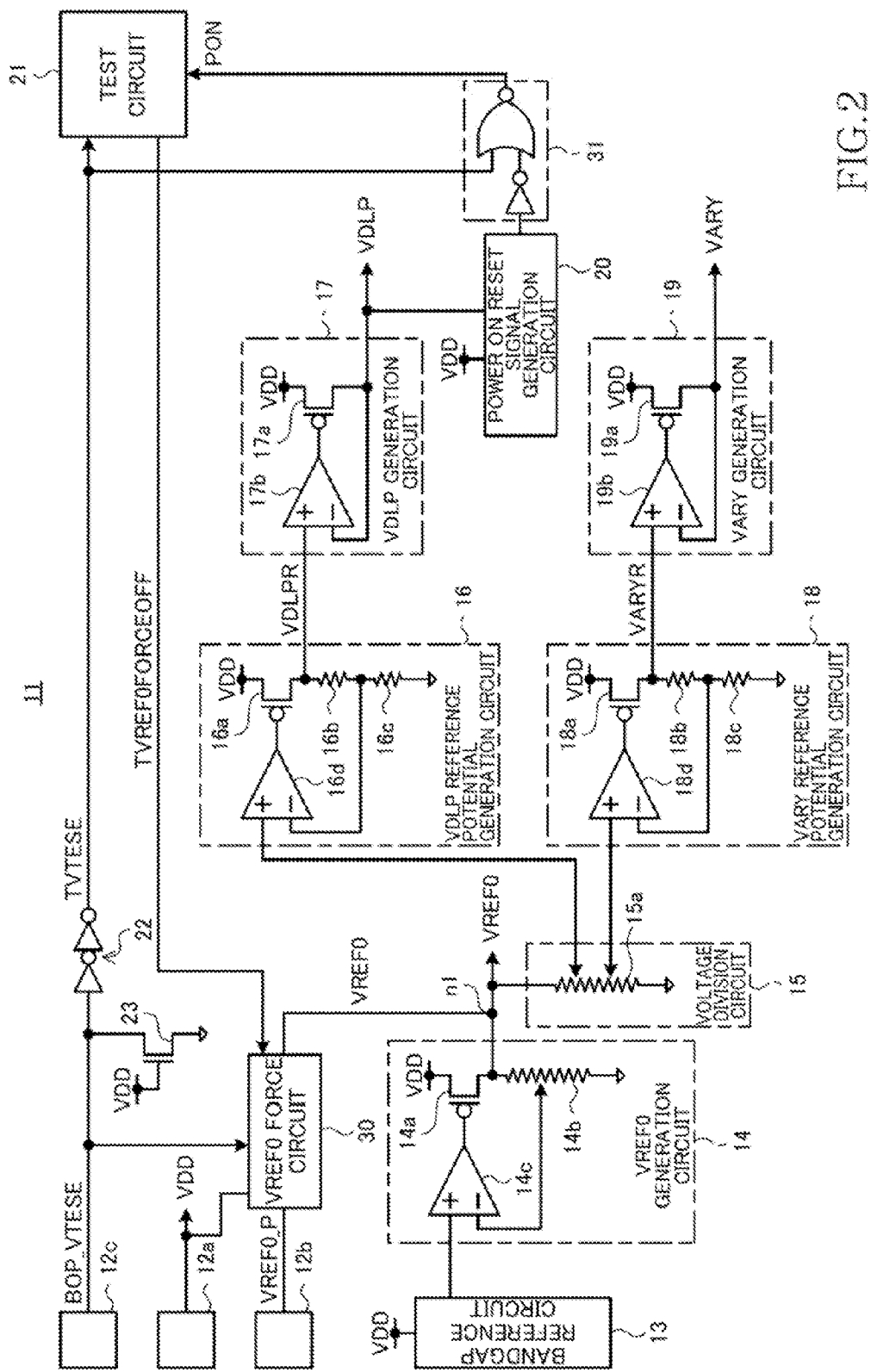
FIG. 2 shows an internal configuration of a semiconductor chip shown in FIG. 1.

Next, as can be understood by comparison between FIGS. 2 and 6, each of the semiconductor chips 11 has a configuration in which a VREF0 force circuit 30 (internal-potential force circuit) and a power-on reset-signal control circuit 31 are added to the semiconductor chip 102. The test circuit 21 is configured to be capable of generating a force-off signal TVREF0FORCEOFF. In other respects, the semiconductor chip 11 has the same configuration as that of the semiconductor chip and thus explanations are given below focusing on the differences.

To the VREF0 force circuit 30, the power supply potential VDD, the reference potential VREF0_P, and the test signal BOP_VTESE are supplied from the tester 50. The force-off signal TVREF0FORCEOFF is supplied from the test circuit 21. Based on the potentials and the signals, the VREF0 force circuit 30 generates the reference potential VREF0 and supplies the reference potential VREF0 to the first node n1.

Figure 3:
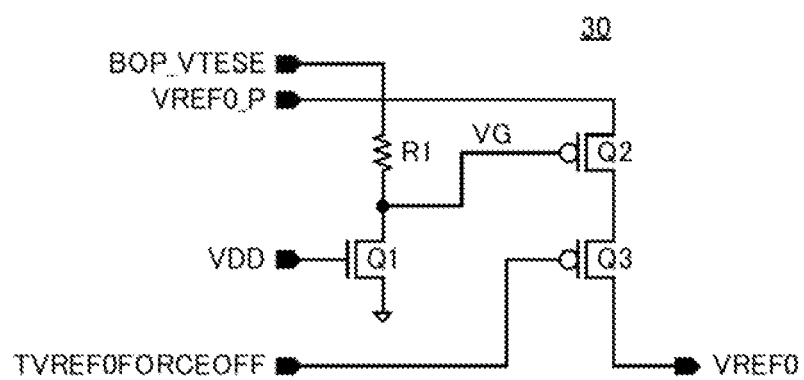
FIG. 3 shows an internal configuration of a VREF0 force circuit shown in FIG. 2.

Specifically, as shown in FIG. 3, the VREF0 force circuit 30 is configured to have an N-channel MOS transistor Q1, P-channel MOS transistors Q2 and Q3 (first and second switch elements), and a resistor R1. The resistor R1 and the transistor Q1 are connected in series between an input end for the test signal BOP_VTESE and the ground line. The transistors Q2 and Q3 are connected in series between an input end for the reference potential VREF0_P and an output end for the reference potential VREF0. The power supply potential VDD is supplied to a control electrode (a gate electrode) of the transistor Q1. A potential VG of a connection point between the resistor R1 and the transistor Q1 is supplied to a control electrode (a gate electrode) of the transistor Q2. The force-off signal TVREF0FORCEOFF is supplied to a control electrode (a gate electrode) of the transistor Q3.

An on-resistance of the transistor Q1 is set in consideration of a resistance value of the resistor R1 to cause the potential VG to be at a low level (a potential that sets the transistor Q2 ON) when the test signal BOP_VTESE is at a high level. This point is explained in detail later.

Referring back to FIG. 2, the power-on reset-signal control circuit 31 is a circuit that generates the power-on reset signal PON based on the output signal of the power-on reset-signal generation circuit 20 and the output signal TVTESE of the buffer 22 (=the test signal BOP_VTESE). Specifically, as is clear from a logic circuit shown in FIG. 2, the power-on reset-signal control circuit 31 is configured to fix the power-on reset signal PON at a low level when the output signal TVTESE is at a high level and to output the output signal of the power-on reset-signal generation circuit 20 as the power-on reset signal PON when the output signal TVTESE is at a low level.

The test circuit 21 is configured to activate the force-off signal TVREF0FORCEOFF to a high level in response to activation of the power-on reset signal PON to a high level and return the force-off signal TVREF0FORCEOFF to a low level upon passage of a predetermined time from activation of the force-off signal TVREF0FORCEOFF.

Figure 4:
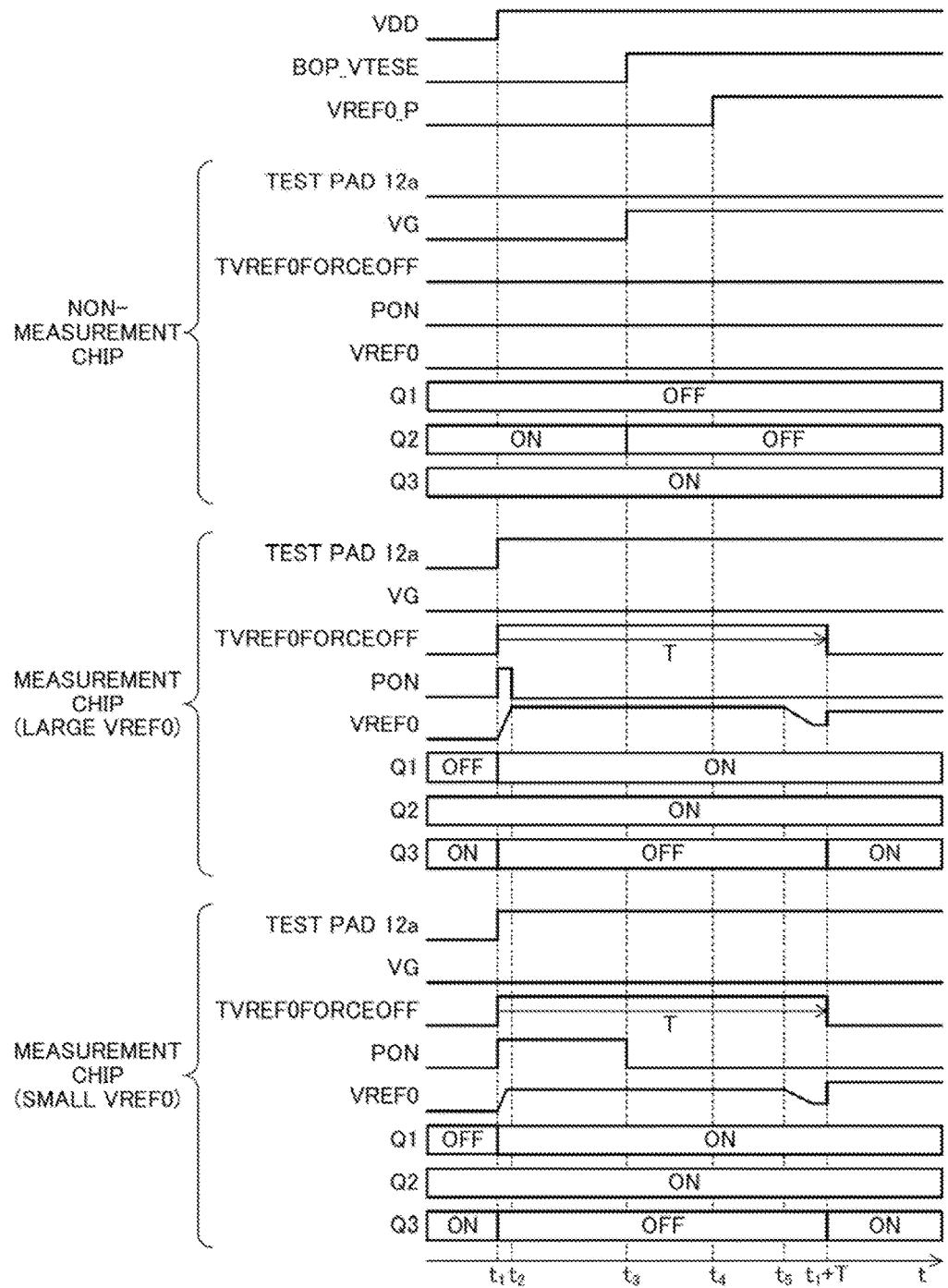
FIG. 4 is a timing chart of various signals related to a wafer test.

An operation of the VREF0 force circuit 30 having the above configuration is explained in detail below with reference to a timing chart of FIG. 4. In FIG. 4, timing charts of the semiconductor chips 11 not being tested (represented as "non-measurement chip") and the semiconductor chips 11 being tested (represented as "measurement chip") are shown. With respect to the semiconductor chip 11 being tested, timing charts in a case (represented as "large VREF0") where the reference potential VREF0 generated by the VREF0 generation circuit 14 is larger than an original potential (a potential after the first connection intermediate point mentioned above is fixed) and in a case (represented as "small VREF0") where the reference potential VREF0 is smaller than the original potential are shown.

As shown in FIG. 4, the tester 50 performs an operation of starting supply of the power supply potential VDD at a time $t_1$, then activating the test signal BOP_VTESE to a high level at a time $t_3$, and starting supply of the reference potential VREF0 at a time $t_4$. Although supply of the command signal CMD is not shown in FIG. 4, the tester 50 is configured to start supply of the command signal CMD after passage of a predetermined time T from the time $t_1$.

Upon start of supply of the power supply potential VDD at the time $t_1$, the potential of the test pad 12a in the semiconductor chip 11 being tested, in which the corresponding first relay 41 (FIG. 1) is in a connection state, changes from a low level (first level) to a high level (second level). As a result, the power-on reset-signal generation circuit 20 activates the power-on reset signal PON to a high level and further the test circuit 21 activates the force-off signal TVREF0FORCEOFF to a high level.

Meanwhile, in each of the semiconductor chips 11 not being tested, the first relay 41 shown in FIG. 1 is in a disconnection state and thus the potential of the test pad 12a does not change even when the tester 50 starts supply of the power supply potential VDD. Therefore, the power-on reset-signal generation circuit 20 does not operate and accordingly neither the power-on reset signal PON nor the force-off signal TVREF0FORCEOFF is activated.

In the semiconductor chip 11 being tested, generation of the reference potential VREF0 by the VREF0 generation circuit 14 is started. However, because the first connection intermediate point is not fixed yet at this stage, the reference potential VREF0 generated by the VREF0 generation circuit 14 varies among the semiconductor chips 11. FIG. 4 shows two patterns of the variations (in the case where the reference potential VREF0 is larger than the original potential and in the case where the reference potential VREF0 is smaller than the original potential).

When the reference potential VREF0 generated by the VREF0 generation circuit 14 is larger than the original potential (in the case of "large VREF0"), the power-on reset-signal generation circuit 20 returns the power-on reset signal PON to be deactivated at a time $t_2$ ($<t_3$) when the reference potential VREF0 rises as shown in FIG. 4. Therefore, the test circuit 21 is in the normal operation mode during a period from the time $t_2$ to the time $t_3$. After the time $t_3$ when the test signal BOP_VTESE is activated to a high level, the test circuit 21 is in a state of entering the test mode.

On the other hand, when the reference potential VREF0 generated by the VREF0 generation circuit 14 is sufficiently smaller than the original potential (in the case of "small VREF0"), the power-on reset signal PON does not return to be deactivated even at the time $t_2$ when the reference potential VREF0 rises as shown in FIG. 4. This is because the power-on reset-signal generation circuit 20 cannot recognize that the internal potential VDLP is at a high level.

However, because each of the semiconductor chips 11 includes the power-on reset-signal control circuit 31, the power-on reset signal PON returns to be deactivated at the time $t_3$ when the test signal BOP_VTESE is activated to a high level at the latest, regardless of levels of the reference potential VREF0 generated by the VREF0 generation circuit 14. Therefore, in any case, the test circuit 21 is in the state of entering the test mode after the time $t_3$.

States of the transistors Q1 to Q3 shown in FIG. 3 are explained in detail below. As can be understood with reference to a circuit diagram of FIG. 3, the transistor Q1 is in an off-state and the transistors Q2 and Q3 are in an on-state in any of the semiconductor chips 11 at a stage before the time $t_1$ when the tester 50 starts supply of the power supply potential VDD.

In the semiconductor chip 11 being tested, the transistor Q1 becomes an on-state in response to a situation that the potential of the test pad 12$a$ is at a high level at the time $t_1$. Therefore, the potential VG is at a low level at least until the time $t_3$ when the test signal BOP_VTESE is activated to a high level. As mentioned above, because the on-resistance of the transistor Q1 is set to cause the potential VG to be at a low level when the test signal BOP_VTESE is at a high level, the potential VG keeps a low level also after the time $t_3$. Therefore, as shown in FIG. 4, the transistor Q2 keeps an on-state.

Meanwhile, because the force-off signal TVREF0FORCEOFF is activated to a high level until the predetermined time T passes after the time $t_1$, the transistor Q3 becomes an off-state. After passage of the predetermined time T from the time $t_1$, the force-off signal TVREF0FORCEOFF returns to be deactivated and the transistor Q3 also returns to an on-state. The predetermined time T is set to cause a time $t_1+T$ to be after the time $t_4$, and thus the reference potential VREF0 appearing at the first node n1 after the transistor Q3 becomes ON at the time $t_1+T$ is at a level equal to a potential level of the reference potential VREF0_P supplied from the tester 50.

In this case, as shown in FIG. 4, the reference potential VREF0 decreases once at a time $t_5$ between the time $t_4$ and the time $t_1+T$. This is due to a change in the position of the first connection intermediate point mentioned above through an operation of a trimming circuit to forcibly reduce the output potential of the VREF0 generation circuit 14. Because each of the semiconductor chips 11 uses the P-channel MOS transistor 14$a$ at an output stage of the VREF0 generation circuit 14, the potential of the first node n1 can be caused to be higher than the output potential of the VREF0 generation circuit 14 by externally supplying a potential to the first node n1; however, it is difficult to cause the potential of the first node n1 to be lower than the output potential of the VREF0 generation circuit 14. By reducing the output potential of the VREF0 generation circuit 14 before the time $t_1+T$ comes as mentioned above, the potential of the first node n1 can be matched with the potential level of the reference potential VREF0_P.

In each of the semiconductor chips 11 not being tested, the potential of the test pad 12$a$ is not at a high level and thus the transistor Q1 keeps an off-state. As a result, after the force-off signal TVREF0FORCEOFF is activated to a high level at the time $t_3$, the transistor Q2 becomes an off-state and keeps this state thereafter. Accordingly, the test pad 12$b$ and the first node n1 become disconnected from each other and thus the reference potential VREF0_P is not supplied to the first node n1 even when the tester 50 starts supply of the reference potential VREF0_P at the time $t_4$. That is, in the wafer test system 1, the reference potential VREF0_P is not supplied to the semiconductor chips 11 not being tested although the probe card 40 does not include the second relays 42. Therefore, a flow of the leak current L as shown in FIG. 6 can be prevented, thereby preventing the tester 50 from lacking the current supply capacity.

As explained above, the VREF0 force circuit 30 can disconnect the first node n1 from the test pad 12$b$ when the test signal BOP_VTESE supplied to the test pad 12$c$ is activated and the potential level of the test pad 12$a$ is at a low level. Therefore, lack of the current supply capacity of the tester due to a leak current flowing from the first node n1 toward the VREF0 generation circuit 14 can be prevented without the second relays 42 in the probe card 40. Accordingly, the number of relays to be mounted on the probe card 40 can be reduced.

Furthermore, because the power-on reset-signal control circuit 31 is provided to fix the power-on reset signal PON to a low level when the output signal TVTESE is at a high level, the power-on reset signal PON can be returned to a low level to cause the test circuit 21 to enter the test mode responding to activation of the test signal BOP_VTESE (that is, start of a test) even when the output potential of the VREF0 generation circuit 14 is at a level lower than the original potential level.

It is apparent that the present invention is not limited to the above embodiments, but may be modified and changed without departing from the scope and spirit of the invention.

What is claimed is:

1. A semiconductor device comprising:
a first external terminal configured to be supplied with a power supply potential from outside the semiconductor device;
a second external terminal configured to be supplied with a first internal potential from outside the semiconductor device;
a third external terminal configured to be supplied with a test signal to be activated when the semiconductor device enters a test mode;
a first internal-potential generation circuit configured to generate the first internal potential from the power supply potential and output the first internal potential to a first node; and
an internal-potential force circuit that includes a first switch element coupled between the first node and the second external terminal,
the internal-potential force circuit configured to cause the first switch element to enter into an off-state when the test signal supplied to the third external terminal is activated and a potential level of the first external terminal is at a first level, and cause the first switch element to enter into an on-state when the test signal supplied to the third external terminal is activated and the potential level of the first external terminal is at a second level different from the first level.

2. The semiconductor device as claimed in claim 1, further comprising:
an internal circuit configured to operate on the power supply potential;
a second internal-potential generation circuit configured to generate a second internal potential from the first internal potential supplied to the first node;
a power-on reset signal generation circuit configured to generate a power-on reset signal to be activated when the power supply potential is at the second level and be deactivated when both of the power supply potential and the second internal potential are at the second level; and a power-on reset signal control circuit configured to deactivate the power-on reset signal regardless of an output of the power-on reset signal generation circuit when the test signal supplied to the third external terminal is activated, wherein the internal circuit is configured to perform a reset operation when the power-on reset signal is activated and to perform a normal operation when the power-on reset signal is deactivated.

3. The semiconductor device as claimed in claim 2, wherein the internal circuit is configured to generate a force-off signal that is activated upon activation of the power-on reset signal and that returns to be deactivated when a predetermined time passes after activation, and the internal-potential force circuit further includes a second switch element that is provided in series with the first switch element to become an off-state when the force-off signal is activated and to become an on-state when the force-off signal is deactivated.

4. The semiconductor device as claimed in claim 3, wherein supply of the first internal potential to the second external terminal is started at a timing after the test signal is activated and before the force-off signal returns to be deactivated.

5. The semiconductor device as claimed in claim 3, wherein the first internal-potential generation circuit is controlled to cause a generated potential level of the first internal potential to be lower than a potential level of the first internal potential supplied from outside to the second external terminal at least at a timing before the force-off signal returns to be deactivated.

6. The semiconductor device as claimed in claim 1, further comprising a bandgap reference circuit configured to output a constant voltage, wherein the first internal-potential generation circuit generates the first internal potential based on an output voltage of the bandgap reference circuit.

\* \* \* \* \*